United States Patent
Wang et al.

[19]

[11] Patent Number: 6,018,190
[45] Date of Patent: Jan. 25, 2000

[54] I/O CARD DEVICE AND METHOD FOR MAKING THE SAME

[75] Inventors: Kuo-Cheng Wang, Tu-Cheng; Chin-Shen Wu, Yung-Ho; Charles Chou, Taipei Hsien, all of Taiwan

[73] Assignee: Hon Hai Precision Ind. Co., Ltd., Taipei Hsien, Taiwan

[21] Appl. No.: 09/028,954

[22] Filed: Feb. 23, 1998

[30] Foreign Application Priority Data

Feb. 21, 1997 [TW] Taiwan .................................. 86202884

[51] Int. Cl.[7] ..................................................... H01L 23/02
[52] U.S. Cl. .......................................... 257/679; 257/723
[58] Field of Search .................................. 257/679, 723, 257/678, 698; 361/737, 796

[56] References Cited

U.S. PATENT DOCUMENTS 5,493,477 2/1996 Hirai ........................................ 257/679

Primary Examiner—Carl Whitehead, Jr.
Assistant Examiner—Roy Potter

[57] ABSTRACT

An I/O card device includes a metallic, rectangular upper cover having two longitudinal sides each having an L-shaped cross-section with a bottom wall facing each other and defining a number of holes, an upper insulative frame injection molded to the upper cover to fixedly connect therewith in which the upper frame fills the holes of the longitudinal sides, a lower metallic cover having a structure similar to the upper cover, a lower insulative frame having a structure similar to the upper frame and insert molded to the lower cover to fill the holes thereof. The upper frame and lower frame are connected together by ultrasonic soldering. A front connector is fixed to a front end of the device by engaging two lateral mounting ears of the front connector to front ends of the upper and lower frames. A rear connector is fixed to a rear end of the device by engaging two lateral mounting ears of the rear connector to rear ends of the upper and lower frames. A printed circuit board is fixedly received in the device and electrically connected to the front and rear connectors.

4 Claims, 3 Drawing Sheets

I/O CARD DEVICE AND METHOD FOR MAKING THE SAME

BACKGROUND OF THE INVENTION

1. Field of the Invention

The present invention relates to an I/O card device, and particularly to an I/O card device having a secure engagement structure between metallic covers and insulative frames thereof for ensuring that the frames will not become disengaged from the covers even after extended use of the I/O card device, whereby connectors fitted with the frames can be securely fixed in position for ensuring a stable electrical signal transmission between the device and a computer incorporating the device.

2. The Prior Art

An I/O card device is inserted into a card connector of a computer for expanding functions of the computer. Conventionally, the I/O card device consists of an upper and a lower metallic cover, an upper and a lower dielectric frame, a printed circuit board (PCB) and two connectors. The frames are mounted to the upper and lower covers by clamping engaging tabs formed by the covers onto the frames. The connectors which have been soldered to the PCB are mounted to the device by fitting mounting ears thereof into the frames. Such prior art is disclosed in U.S. Pat. Nos. 5,242,310, 5,339,222, and 5,397,857.

The covers and the frames of the conventional I/O card devices do not have a secure connection therebetween, therefore after extended use of the card device, the frames may disengage from the covers thereby causing the connectors to move relative to the covers which adversely affects the signal transmission between the computer and the I/O card device.

To overcome the above disadvantage, U.S. Pat. No. 5,502,892 proposes to injection mold the frames directly to the covers. Although this method improves the connection between the covers and the frames, the injection molding process does not enhance the mechanical engagement between the frames and the covers, which still causes the frames to disengage from the covers after extended use of the I/O card device.

Hence, an improved I/O card device is needed to eliminate the above mentioned defects of current I/O card devices.

SUMMARY OF THE INVENTION

Accordingly, an objective of the present invention is to provide an I/O card device with insulative frames fitted with connectors, wherein the frames remain securely fixed to metallic covers even after extended use of the I/O card device.

A further objective of the present invention is to provide a method for forming an I/O card device in which frames of the device are injection molded to metallic covers thereof and are mechanically engaged to be securely fixed to the metallic covers.

To fulfill the above mentioned objectives, according to an aspect of the present invention, a method for forming an I/O card device includes the following steps: preparing a pair of metallic rectangular covers each including longitudinal sides each having an L-shaped cross-section with a bottom wall formed with a number of holes therealong, injection molding frames to the longitudinal sides of the covers to fill the holes of the bottom walls and form connector fitting slots at opposite ends of each of the frames, preparing two connectors soldered to a PCB and mounting the connectors with the PCB to one of the frames fixed to a corresponding one of the covers by fitting mounting ears of the connectors to the connector fitting slots of the frame to form a subassembly for the device. Thereafter, the other frame together with the other cover is assembled to the subassembly by fitting the mounting ears of the connectors into the connector mounting slots formed by the other frame. Finally a ultrasonic soldering is applied to the frames to fixedly connect them together and complete the assembly of the I/O card device.

DETAILED DESCRIPTION OF THE PREFERRED EMBODIMENT

Reference will now be made in detail to the preferred embodiment of the present invention.

Figure 1:
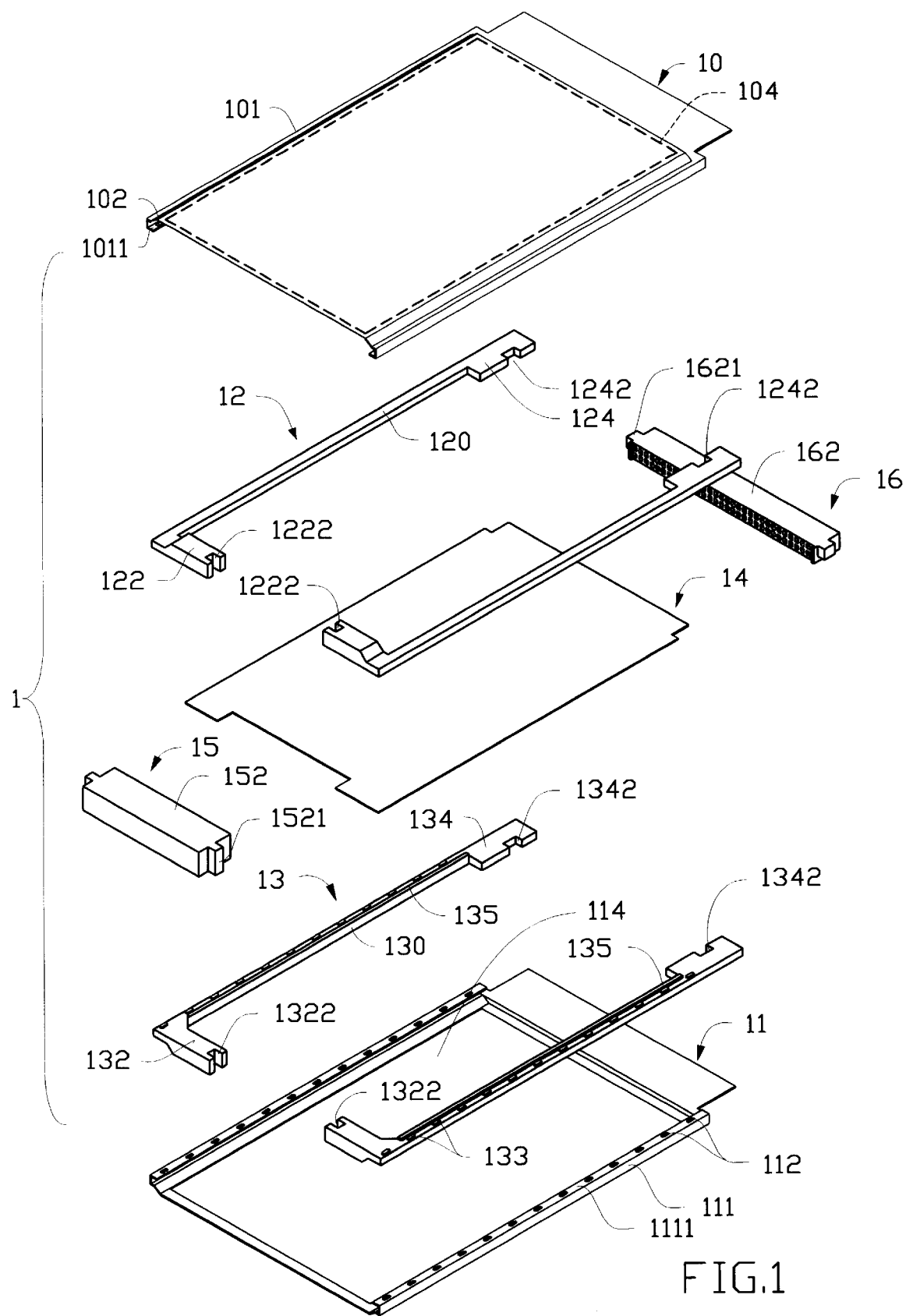
FIG. 1 is an exploded, perspective view showing components constituting an I/O card device in accordance with the present invention.
Figure 2:
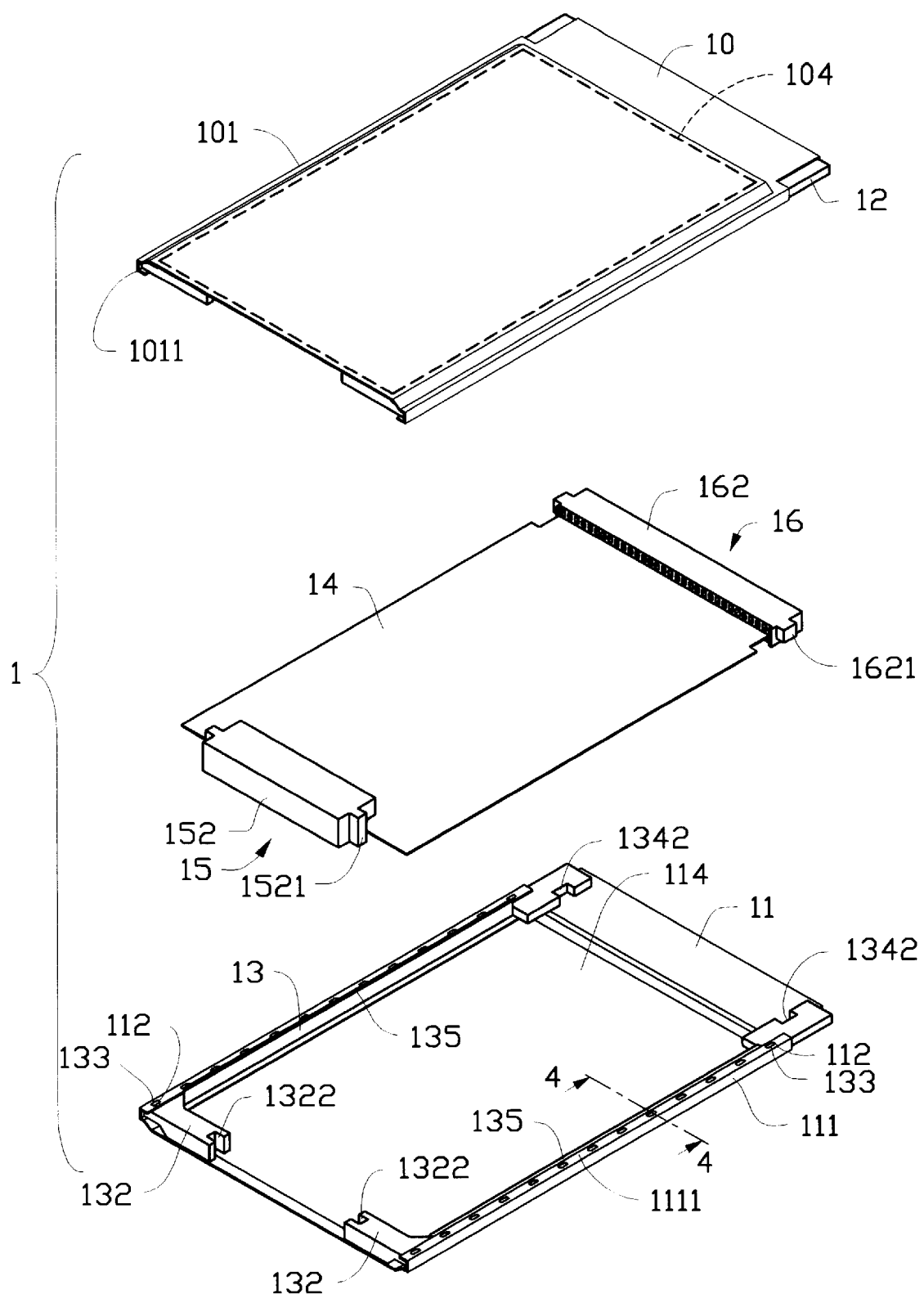
FIG. 2 is a partially assembled view of FIG. 1.

As shown in FIG. 1, an I/O card device 1 in accordance with the present invention consists of an upper, rectangular metallic cover 10 forming two longitudinal sides 101 each having an L-shaped cross-section with a bottom wall 1011 extending toward each other and defining a number of holes 102 therealong. An insulative sheet 104 is attached to a bottom surface of the upper cover 10. An upper dielectric frame (not labeled) consists of a pair of upper frame members 12 each having an elongate body portion 120, a laterally extending front mounting arm 122 defining a first slot 1222 in a free end thereof and a laterally extending rear mounting flange 124 defining a second slot 1242 in a free end thereof. The upper frame members 12 are formed and fixed to the upper cover 10 by injection molding (also called "insert molding") them to the two longitudinal sides 101 of the upper cover 10 whereby plastic used for forming the body portions 120 fill the holes 102 so that the frame members 12 fixedly engage with the upper cover 10 thereby firmly attaching the insulative sheet 104 to the upper cover 10, as shown in FIG. 2. More clear and detailed descriptions will be made concerning the connection of a lower dielectric frame (not labeled) to a lower metallic cover 11 which have structures similar to the upper ones and are also connected by injection molding.

Front and rear connectors 15, 16 are each formed with a rectangular body 152, 162 forming two mounting ears 1521, 1621 on two lateral sides thereof, respectively. A printed circuit board 14 having a number of electronic components (not shown) mounted thereon is electrically connected to the front and rear connectors 15, 16 by soldering, as shown in FIG. 2.

The lower frame (not labeled) consists of a pair of lower frame members 13 each formed with an elongate body portion 130 with a laterally extending front mounting arm 132 defining a third slot 1322 in a free end thereof and a laterally extending rear mounting flange 134 defining a fourth slot 1342 in a free end thereof.

The lower metallic rectangular cover 11 is also formed with two longitudinal sides 111 each having an L-shaped configuration with a top wall 1111 defining a number of holes 112 therealong.

Figure 4:
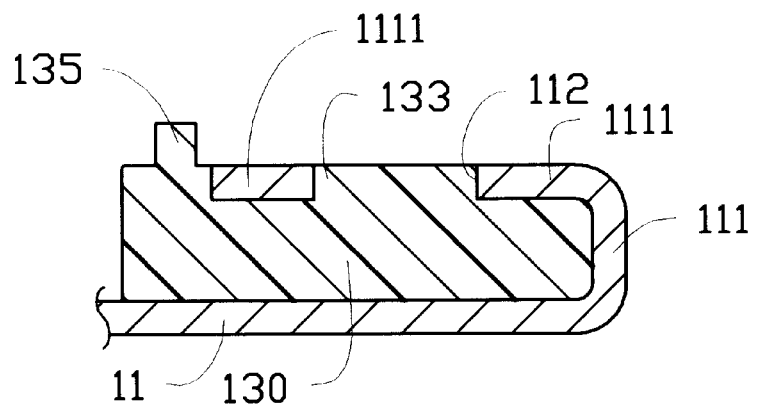
FIG. 4 is a cross-sectional view taken along line 4—4 of FIG. 2.

Also referring to FIGS. 2 and 4, when the lower frame members 13 are injection molded to the two longitudinal sides 111 of the lower cover 11, plastic used for forming the body portions 130 fill the holes 112 to form beads 133 fixedly engaging with the top walls 1111 of the longitudinal sides 111 of the lower cover 11 so that the lower frame members 13 are securely fixed to the lower cover 11. The body portions 130 are each further formed with a soldering tongue 135 protruding upwardly from a top face (not labeled) thereof and located beside the beads 133. An insulative sheet 114 is fixedly attached to a top surface of the lower cover 11 by the lower frame members 13.

Figure 3:
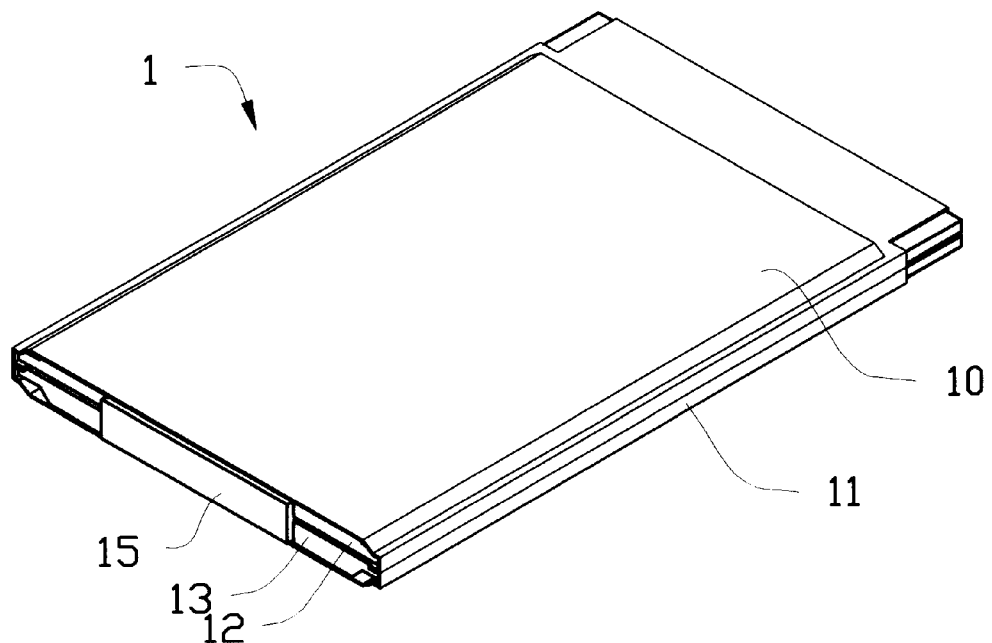
FIG. 3 is a perspective view of the assembled I/O card device.

To assemble the I/O card device 1, the front connector 15 together with the rear connector 16 and the printed circuit board 14 is assembled with the combination of the lower cover 11, the insulative sheet 114 and the lower frame members 13 by mounting the body 152 of the front connector 15 to a front end (not labeled) of the lower cover 11 and fitting the mounting ears 1521 thereof into the third slots 1322, and mounting the body 162 of the rear connector 16 to a rear end (not labeled) of the lower cover 11 and fitting the mounting ears 1621 thereof into the fourth slots 1342 to form a subassembly for the I/O card device 1. Then, the upper cover 10 together with the insulative sheet 104 and the upper frame members 12 is assembled to the subassembly by fitting the mounting ears 1521 into the first slots 1222 and the mounting ears 1621 into the second slots 1242, in which the soldering tongues 135 of the lower frame members 13 are in connection with the soldering tongues (not shown) formed on lower faces (not shown) of the body portions 120 of the upper frame members 12. Thereafter, the assembly is subject to an ultrasonic soldering operation to melt the soldering tongues thereby connecting the frame members 12, 13 together to obtain the assembled I/O card device 1 as shown in FIG. 3.

The injection molding of the frame members 12, 13 to the covers 10, 11 causes the frame members 12, 13 to have a portion thereof extending into the holes 102, 112 defined in the covers 10, 11, respectively, therefore the frame members 12, 13 have not only a chemical bonding but also a mechanical engagement with the covers 10, 11 which is non-obvious and advantageous over the teaching of U.S. Pat. No. 5,502,892. The present invention achieves a secure connection between the frame members 12, 13 and the covers 10, 11 to ensure that the connectors 15, 16 are fixed in position even after extended use of the I/O card device 1.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

We claim:

1. An I/O card device, comprising:

a first metallic, rectangular cover comprising two longitudinal sides, one of the longitudinal sides defining at least one hole;

a first insulative frame injection molded to the longitudinal sides of the first cover and filling said at least one hole thereby providing secure engagement with the first cover;

a second metallic, rectangular cover which is similar to the first cover, being securely engaged with an associated second insulative frame which is similar to said first frame;

a connector fitted to at least one of the first insulative frame and said second insulative frame; and means for fastening said first cover and said second cover together.

2. The device in accordance with claim 1, wherein the longitudinal side defining the at least one hole has an L-shaped configuration with a bottom wall extending toward an inside of the cover, and wherein the at least one hole is defined by the bottom wall.

3. The device in accordance with claim 2, wherein the first frame is formed to have an elongate body portion having at least one bead for filling the at least one hole of the first cover, and wherein at least one of the first and second frames comprises a first end having a laterally extending connector mounting arm defining a slot, said connector having a lateral mounting ear fittingly received in the slot.

4. The device in accordance with claim 1 further comprising an insulative sheet fixedly attached between the first frame and the first cover.

* * * * *